Sept. 8, 1970 J. P. KIRK 3,528,048

METHOD OF CONSTRUCTING PRINTED CIRCUITS FOR SUBSEQUENT COMPLETION OR DELETION

Filed July 6, 1967

2 Sheets-Sheet 1

INVENTOR.
JOSEPH P. KIRK

BY K. P. Johnson
ATTORNEY

Sept. 8, 1970 J. P. KIRK 3,528,048

METHOD OF CONSTRUCTING PRINTED CIRCUITS FOR SUBSEQUENT COMPLETION OR DELETION

Filed July 6, 1967 2 Sheets-Sheet 2

United States Patent Office 3,528,048
Patented Sept. 8, 1970

3,528,048

METHOD OF CONSTRUCTING PRINTED CIRCUITS FOR SUBSEQUENT COMPLETION OR DELETION

Joseph P. Kirk, London, England, assignor to International Business Machines Corporation, Armonk, N.Y., a corporation of New York Filed July 6, 1967, Ser. No. 651,500
Int. Cl. H01h 37/76
U.S. Cl. 337—401 7 Claims

ABSTRACT OF THE DISCLOSURE

A process for printed circuit manufacture wherein conductive blocks of a low-melting point metal are incorporated with the circuit lines as sections thereof for subsequent heating to selectively open or close the circuit line.

BACKGROUND OF THE INVENTION

The use of "printed circuit" boards in present day electronic equipment has facilitated the packaging of large numbers of circuits and components in a relatively small volume. Each circuit board may contain several circuits so that there are required different conductor configurations on the insulative substrates of the boards to accommodate the various components and interconnections. Hence, in the construction of a complex electronic machine, there may be used hundreds of circuit boards representing dozens of different circuit configurations on the boards. Thus, it can be appreciated that manufacturing facilities must have the capability of producing numerous board types and also a relatively large portion of the warehouse area will be required for stocking the various board types in quantity. This problem is compounded with the occurrence of continuing engineering circuit changes which require that circuit boards already installed in machines be replaced with other boards having newer, improved circuits. Such replacement results in discarding the older board and installing the newly designed boards. The cataloging and stocking of the required large number of board types consequently creates a large overhead cost.

One attempt at construction to provide versatility has been to include circuit lines which are interconnected in a grid pattern and the unwanted connections are selectively punched out. Another construction is to provide a circuit board with holes in the circuit lines that are selectively filled with solid or liquid conductive plugs to provide the desired interconnection. An alternative proposal has been to place horizontal and vertical conductors on opposite sides of an insulative base panel and weld selected conductors through the panel to form the circuits.

These proposed methods have certain disadvantages in that punched or welded electrodes are relatively large and thus limit the minimum size of the circuit board. The insertion of conductive plugs is a relatively slow process and open to frequent errors. Although these processes can be automated, relatively large, expensive machines are required to accomplish the circuit layout.

Accordingly, it is a primary object of this invention to provide a novel printed circuit board having circuits thereon which can be readily modified to produce a different circuit configuration.

It is another object of this invention to provide a method of producing circuit boards in which the circuits thereon are adapted for modification to produce other and different circuit configurations.

Another object of this invention is to provide a printed circuit board having conductive circuit lines thereon including a different conductive material which can be selectively melted to join two of the conductive circuit lines to thus provide a new circuit configuration.

A further object of this invention is to provide a printed circuit board having conductive circuit lines thereon which include as a portion thereof a different conductive material joining two of said circuit lines, which can be selectively melted to separate those two circuit lines and produce an open circuit therein.

Another object of this invention is to provide a method of placing discrete bodies of low melting point, conductive material at predetermined locations within printed circuit lines which can be melted to selectively join or open existing circuits.

Yet another object of this invention is to provide a novel method of forming conductive circuits on the opposite sides of an insulative layer with a different conductive material sealed therebetween which can be selectively melted thereafter to join the opposite circuits.

A still further object of this invention is to provide a method of producing a crossover between two printed circuit conductors on the same side of an insulative board on which the inherent surface tension of a conductive material is used to form the bridge over one of the conductors.

SUMMARY OF THE INVENTION

The foregoing objects are attained with this invention by utilizing the inherent surface tension of a molten conductive metal which has a melting point lower than that of the printed circuit metal. A block or slug of metal such as solder is preformed into oblong bodies having high surface to volume ratios at predetermined locations on an insulative substrate in conjunction with the printed circuits. The solder slugs can thereafter be selectively heated to the molten state so that the inherent surface tension creates a change in configuration.

In the case of circuit completion, a solder slug is formed in an opening between printed circuit lines, usually of copper. The slug has a width and thickness which are a minor fraction of its length and the slug is placed in contact with one of the copper circuit lines such that its longitudinal axis is normal to the longitudinal axis of the circuit line. The slug is spaced from the other circuit line end sufficiently to maintain an open circuit. When the connection between the two circuit lines is desired, the solder slug is heated to the molten state whereupon the inherent surface tension causes the slug to substantially form a globule having a diameter greater than the former width of the slug. This change in configuration thus connects the two circuit lines to provide a new circuit.

In the case of circuit deletion, the solder slug is connected in series with two printed circuit lines such that the longitudial axes of the slug and the lines are coincidental. The form of the slug is oblong as described above. When the slug is heated to the molten state, the surface tension forms the slug into a globule at each circuit line end with a separation at the former center of the slug. This change creates a break in the line to produce an open circuit.

Circuit crossovers can be produced by etching one conductor portion at the crossover location to a fraction of the original thickness and then covering the etched conductor with an insulative material. The crossing circuit is thereafter formed by etching and separated from the first circuit line by a narrow gap on each side. Molten solder is placed on the insulation material and crossing conductors to join the crossing conductor portions. When the gap between the first conductor and crossing conductor is sufficiently narrow, the surface tension of the solder is sufficient to produce a bridging effect without filling the gap so that a short circuit is avoided.

The invention has the advantage of enabling a reduction in the number of board types which have to be stocked and manufactured because of the ability to modify the circuits of particular board types to perform the functions required by other board types. A further advantage is that the localized heating of the solder slugs can be performed at places other than a manufacturing plant. This invention also enables printed circuits on opposite sides of an insulative panel to be selectively connected at various points through the panel merely by applying localized heat to melt embedded solder blocks.

The foregoing and other objects, features and advantages of the invention will be apparent from the following more particular description of preferred embodiments of the invention as illustrated in the accompanying drawings.

DESCRIPTION OF PREFERRED EMBODIMENTS

Figure 1:
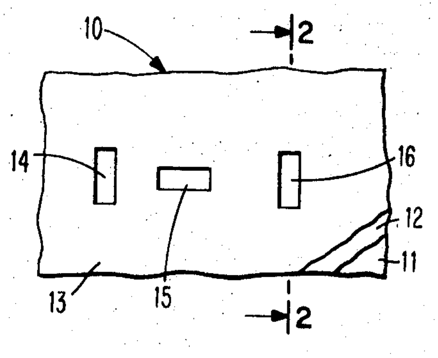
FIG. 1 is a partial plan view of a section of printed circuit board which has undergone an etching step in accordance with the method of the invention.
Figure 2:
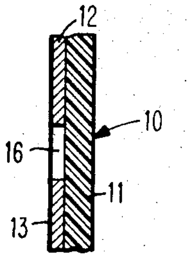
FIG. 2 is a cross-sectional view of the board shown in FIG. 1 and taken along the lines 2—2 thereof.
Figure 6:
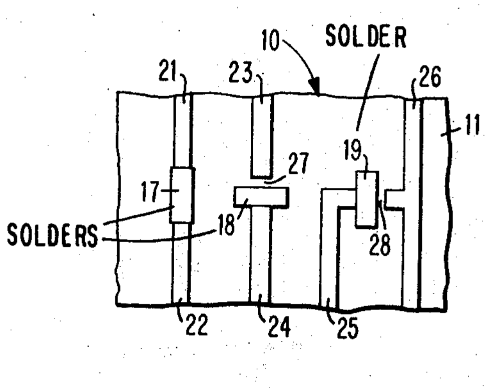
FIG. 6 is a plan view of a portion of a printed circuit board after it has undergone the steps of the invention.

Referring to FIGS. 1 and 2 there is shown a portion of a printed circuit board 10 on which circuits are to be formed so as to appear as shown in FIG. 6. Initially the board is construction in a well-known manner of providing an insulative substrate of material such as glass fiber cloth impregnated with an epoxy resin, and having laminated thereon sheet 12 of conductive metal foil such as copper of a thickness .001 to .003 inch. The usual process of producing the desired circuit lines is to coat the metal foil with a photo-sensitive resistive material 13 and expose the resist through a negative mask with the pattern desired. The unexposed resist is then removed and the metal foil is etched to leave the circuit configuration.

In the process of the invention, however, oblong slugs of electrically conductive metal are to be located at predetermined places with respect to the ultimate copper circuit lines. The metal slugs have a melting point lower than that of the circuit line material and have a high inherent surface tension. Although the slugs can be preformed and located thereafter on the substrate, the forming and locating is more efficient when done by the etching process. Thus in FIGS. 1 and 2 copper foil 12 is coated with a well-known photo-sensitive resistive material 13 that is exposed to light through a negative mask of the slug configuration desired. The soluble resist material in the unexposed areas corresponding to the slug locations 14, 15 and 16 is then washed off and the metal foil thereunder is etched as illustrated by the recess in metal foil 12 in FIG. 2 at slug area 16.

Figure 3:
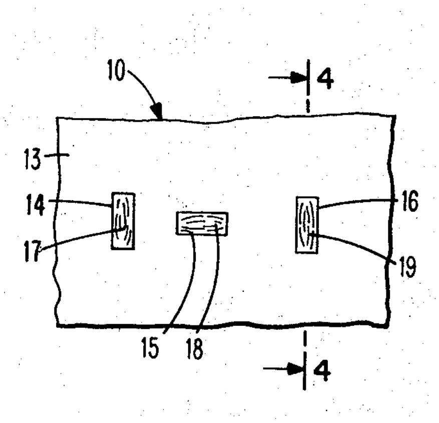
FIG. 3 is another plan view of the portion of the circuit board shown in FIG. 1 but having undergone the additional step of placing solder slugs in etched portions thereof.
Figure 4:
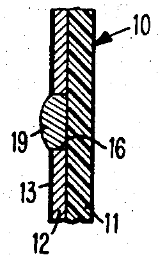
FIG. 4 is a cross-sectional view taken along the lines 4—4 of FIG. 3.
Figure 5:
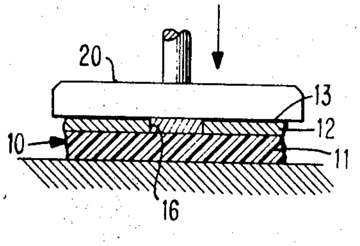
FIG. 5 is a cross-sectional view of the printed circuit board shown in FIG. 4 undergoing the step of compression.

A material which may be used for the slugs is solder suitable for use with the base material which in this case is copper. The solder is usually a tin-lead composition and is flowed over the board and the remaining exposed resist material 13 so that it collects in oblong globules in each etched area 14–16 as seen in FIGS. 3 and 4. The molten solder wets the exposed edges of the copper and adheres thereto. The organic photo-resist is normally solder repellant so that the molten solder collects only in the etched area and is permitted to partially solidify. The globular configurations 17, 18 and 19 of the solder is due to the effective surface tension. Therefore, as shown in FIG. 5 the board with the globules in place is compressed by a heated platen 20 to reform the solder slugs 17–19 into the oblong shape corresponding approximately to the outline of etched pockets 14–16. The compressing is done at a temperature below the melting point of the solder but high enough to permit relatively easy deformation of the solder into the oblong blocks.

At this time the exposed photo-resist is removed and a new coating of resist is applied. The second resist coating is exposed through a negative mask in the same manner as before except that the light is permitted to strike the resist along the desired circuit lines and over the solder slugs. Unexposed resist is washed off and the metal uncovered is then etched away to leave the slugs and circuit as shown in FIG. 6. Thereafter, the exposed resist is removed from the remaining circuit lines 21, 22, 23, 24, 25 and 26 and the slugs 17, 18, and 19 on insulative substrate 11.

Figure 7:
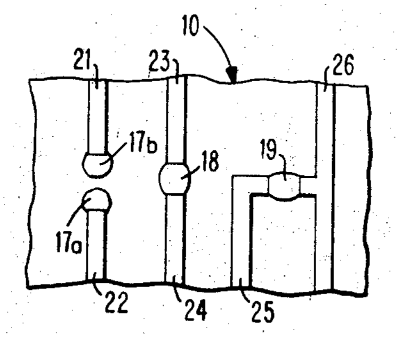
FIG. 7 is a schematic plan view of the board portion shown in FIG. 6 as it would appear after modifying the circuits thereon in accordance with the invention.

Circuit line 21 with slug 19 therein now connects with line 22 to form a continuous circuit. However, line 23 is not coupled with line 24 because of the gap 27, but slug 18 is in contact with line 24. Circuit line 25 is in contact with slug 19 while line 26 is spaced therefrom by a gap 28 so that an open circuit exists between lines 25 and 26. This circuit configuration as shown in FIG. 6 may be desired for a particular board and can be placed into use. However, it may become desirable, subsequently, to alter the circuit in use to the configuration shown in FIG. 7.

The circuit of FIG. 6 may be altered merely by applying localized heat from an electron or laser beam or other closely controlled energy source to any one or all of the slugs shown in FIG. 6. Thus when slug 17 reaches its molten state, the inherent surface tension attempts to reduce the surface to volume ratio by forming a globule. The substrate 11, having been impregnated with an organic material such as an epoxy resin, is not wetted by the molten solder so that the solder does not adhere to the insulation. However, the copper circuit lines are wetted by the solder so that the solder forms a bond to both lines 21 and 22. Where the distance is sufficient, the solder forms a globule at each line and separates near the center of the former slug to produce an open circuit.

Slugs 18 and 19 in circuit lines 23, 24 and 25, 26 each form a single large globule in which the diameter of the globule is sufficient to bridge the respective gaps 27 and 28 to thereby close the circuits. Hence lines 23 and 24 are joined as are lines 25 and 26. While in the molten state the solder wets both copper lines as it reaches across the gaps so that a connection is made to complete the circuits.

In the construction of the slugs, the thickness and width should be a small fraction of the length and the width must be less than the ultimate diameter of any globule formed when the solder reaches a molten condition. The size of the gap to be closed by the solder slug is kept to the minimum which will still prevent arcing and possible short circuits while an open circuit is desired. Since the solder slug is in contact with one circuit line before completion, that circuit line is wetted at the contact area and serves to draw the solder toward the lines so that the globule is formed approximately at the center of the slug in a circuit situation.

Although the method described has been that of first forming etched holes and later forming solder blocks therein, an alternative method is available. One of these methods is to form circuit lines 21–26 as seen in FIG. 6 but without the solder blocks. After the circuit lines have been formed, solder blocks, formed by machine blanking, can be placed in the positions desired to form potential completion or deletion areas. The positioning of the blocks can be done mechanically or by hand.

Figure 8:
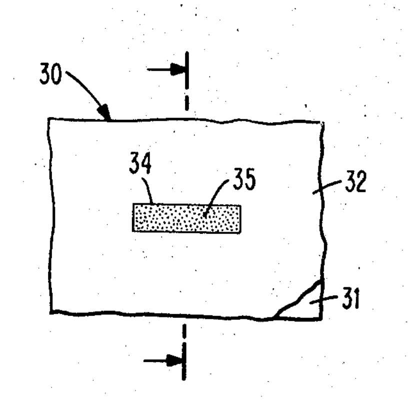
FIGS. 8, 9, 10, 11 and 12 are various plan and cross-sectional views illustrating the construction of a circuit crossover in accordance with the method of the invention.
Figure 9:
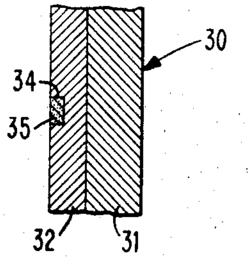

FIGS. 8–12 show the steps in constructing a circuit crossover utilizing the inherent surface tension of molten solder to form the connecting bridge. In FIGS. 8 and 9 a circuit board 30 is comprised of a laminated insulative layer 31 and metal foil 32 such as copper. As in FIG. 1, the board is coated with a photo-resist to leave the resist soluble in area 34. The resist is removed thereat so that the copper foil at area 34 is etched to a depth of approximately one half the original thickness. The exposed resist is then removed and an insulative material 35 is placed in the etched recess at 34.

Figure 10:
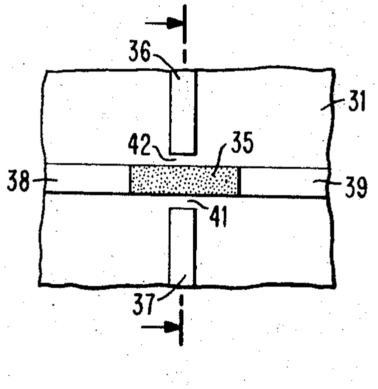
Figure 11:
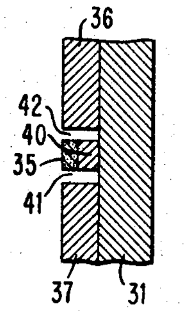
Figure 12:
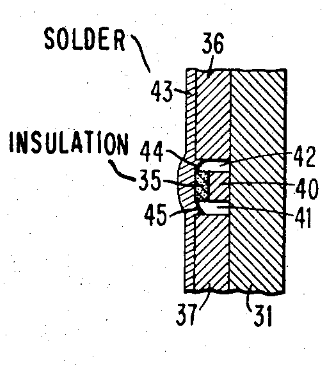

In FIGS. 10 and 11 a second coating of photo-resist is applied and exposed to light at the circuit line areas 35, 36, 37, 38 and 39 so that the remaining foil can be completely removed. Circuit lines 36 and 37 are formed with respect to lines 38 and 39 so as to leave narrow gaps 41 and 42. Circuit lines 38 and 39 are formed as extensions of half-thick portion 40 under insulator 35 to provide a first circuit.

The exposed resist is now removed, the copper lines cleaned, and molten solder 43 is applied to insulative material 35. The solder may be applied by inverting the board and using the solder wave technique to connect lines 36 and 37. With gaps 41 and 42 sufficiently close, the surface tension of the molten solder forms a bridge with fillets 44, 45 to complete a second circuit crossing the first circuit without creating an unwanted connection between line 40 and either of lines 36 or 37.

Figure 13:
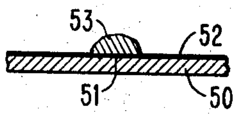
FIGS. 13, 14, 15 and 16 are cross-sectional views illustrating the construction of a selective interconnection between circuits on opposite sides of an insulative layer in accordance with the method of the invention.

The principle illustrated with regard to the completion and deletion of circuits described above can be further used to complete interconnections between printed circuit lines on opposite sides of an insulative substrate as illustrated in FIGS. 13–16. In providing for the possible interconnections, a sheet 50 of copper foil is pretinned at selected area 51 so that solder readily adheres to the copper. Sheet 50 is covered with a solder repellant material 52, such as suitably exposed photo-resist, so as to leave the pretinned area 51 clear. Molten solder is flowed over the coated copper and collects in a globule 53 at the pretinned area 51, as seen in FIG. 13. The globule is compressed (FIG. 14) to produce a flattened slug 53 having a high surface to volume ratio.

Figure 15:
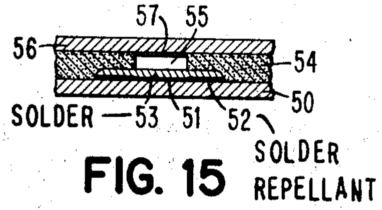
Figure 14:
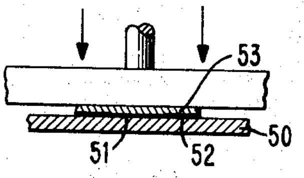

The solder repellant is removed and sheet 50 is laminated, as seen in FIG. 15, with an insulative layer 54 having a hole 55 etched therein by a suitable organic etchant prior to lamination. Thereafter, a second copper sheet 56 having pretinned spot 57 thereon is laminated to the insulative layer. Pretinned spot 57 is aligned with hole 55 and the flattened solder slug. Lamination is done with low temperature adhesives to prevent melting the solder.

Figure 16:
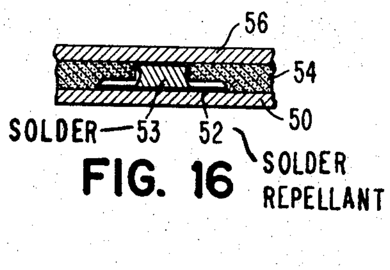

Copper sheets 50 and 56 are etched in the usual manner after lamination to produce the desired circuit configurations. When it is necessary to provide an interconnection between two circuits on opposite sides of the insulative layer 54, the area of solder slug 53 is locally heated to bring the solder to its molten state whereby the slug forms a globule as shown in FIG. 16. This produces the interconnection required through hole 55.

While the invention has been particularly shown and described with reference to preferred embodiments thereof, it will be understood by those skilled in the art that various changes in form and details may be made therein without departing from the spirit and scope of the invention.

What is claimed is:

1. The method of constructing a circuit crossover on a circuit board comprising the steps of:

laminating conductive metal foil to an electrically insulative substrate;

etching said foil to a fraction of its original thickness in a predetermined area;

filling said etched depression with an insulative material;

forming one conductor in electrical continuity with said partial foil thickness and forming a discrete pair of conductors aligned on opposite sides of said one conductor with the longitudinal axes thereof substantially coincidental with one another and normal to the longitudinal axis of said partial foil thickness, each said conductor of said pair being spaced from said partial thickness foil by a minimum space sufficient to maintain an open circuit therewith; and applying molten conductive metal to said insulative material and said pair of conductors adjacent thereto whereby the surface tension of said metal forms a conductive bridge from said material in each direction to one of said conductors in said pair, said molten metal being incapable of wetting the surface of said insulative substrate and material.

2. The method of constructing an insulated crossover between two circuit lines comprising:

laminating a conductive metal foil to an electrically insulative substrate;

etching a portion of said foil to a fraction of its original thickness in a predetermined area;

filling said etched area with an insulative material;

forming a first conductive line in electrical continuity with said fractional portion and forming a second conductive line substantially normal to said portion and having a discontinuity in which said portion lies; and applying to said insulative material over said portion and said second conductive line a molten metal having an inherent surface tension sufficient to bridge said discontinuity to form a continuous electrical circuit in said second line, said molten metal being incapable of wetting the surface of said insulative substrate and material.

3. The method of making an insulative substrate having an electrically conductive circuit patern thereon, comprising the steps of:

laminating a sheet of conductive metal foil to one side of said substrate;

forming an oblong hole in said foil to a depth equal to the thickness of said foil;

placing in said hole an oblong body of conductive metal formed to have a large surface-to-volume ratio, and having a melting point lower than said foil with the inherent tendency to form a globule when in the molten state with a diameter greater than the thickness or width of said body but less than the length thereof, said conductive metal being incapable of wetting the surface of said substrate;

forming a pair of conductive lines in said foil in contact with said body at opposite ends of the longitudinal axis thereof to produce a continuous conductive circuit; and heating said oblong body to its molten state whereby said body reforms in globular fashion to produce an open circuit between said lines.

4. The method as described in claim 3 wherein said oblong body is solder and is placed in said hole by coating said foil with a photo-sensitive resist material and said solder is flowed along said resist surface in a molten state to collect as a globule in said hole and allowed to solidify, and then flattening said globule into said oblong body.

5. The method of making an insulative substrate having a circuit thereon of variable conductance, comprising the steps of:

placing on said substrate an oblong body of conductive metal formed to have a large surface to volume ratio, said metal having the inherent tendency to form a globule when in the molten state with a diameter greater than the width or thickness but less than the length of said oblong body, said oblong body of conductive metal being incapable of wetting the surface of said substrate when in said molten state;

forming on said substrate a pair of circuit lines of conductive metal having a melting temperature higher than said body, each said circuit line being in contact with said body at opposite ends of the longitudinal axis thereof to produce a continuous electrical circuit therewith; and heating said oblong body to its molten state whereby said body reforms in globular fashion producing a discontinuous electrical circuit between said lines.

6. A method of making an electrically conductive substrate with selectively connectable electrical circuit elements thereon comprising the steps of:

forming an opening in said substrate extending between opposite sides thereof;

placing a first circuit element on one side of said substrate extending over one end of said opening;

placing a restrictive coating on a second circuit element except for a predetermined area, securing a solid body of conductive metal to said second circuit element at said area, said body having a large surface-to-volume ratio and extending over said restrictive coating beyond said area, said body being of a thickness less than the length of said substrate opening and having the inherent tendency when molten to form a globule having a diameter at least as great as the length of said opening; and being incapable of wetting said substrate or coating;

positioning said second circuit element on said substrate over the opposite end of said opening with said body extending partially into said opening and out of contact with said first circuit element; and heating said body to its molten state to form a globule and thereby electrically connect said first and second circuit elements.

7. A circuit board comprising:

an electrically insulative substrate having an opening extending between opposite sides thereof;

an electrically conductive first circuit element overlying said opening on one side of said substrate;

an electrically conductive second circuit element overlying the opposite end of said opening;

a coating covering said second circuit element adjacent said opening except for a predetermined area for restrictive connection;

a solid body of conductive metal attached to said second element at said area and etxending partially into said opening, said body being in substantial alignment with said opening and having a large surface-to-volume ratio and the inherent tendency when molten to form a globule having a diameter sufficient to extend through said opening and electrically connect said first and second circuit elements, said solid body overlying said coating beyond said area and being incapable of wetting said coating or said substrate.

References Cited

UNITED STATES PATENTS

| | | | |
|---|---|---|---|
| 3,240,865 | 3/1966 | Jarnagin | 174—68.5 |
| 3,296,360 | 1/1967 | Faler | 174—68.5 |
| 3,378,920 | 4/1968 | Cone. | |

DARRELL L. CLAY, Primary Examiner

U.S. Cl. X.R.

29—625; 156—3; 174—68.5; 337—405